US012749870B2

(12) United States Patent
Lu et al.

(10) Patent No.: US 12,749,870 B2
(45) Date of Patent: Sep. 29, 2026

(54) PLATED TRENCH FOR PARASITIC CAPACITANCE CONTROL OF VERTICAL CAVITY SURFACE EMITTING LASER DEVICES

(71) Applicant: Lumentum Operations LLC, San Jose, CA (US)

(72) Inventors: Chien-Yao Lu, San Jose, CA (US); Albert Yuen, Palo Alto, CA (US); Shibajyoti Ghosh Dastider, Milpitas, CA (US); Yeyu Zhu, San Jose, CA (US)

(73) Assignee: Lumentum Operations LLC, San Jose, CA (US)

( * ) Notice: Subject to any disclaimer, the term of this patent is extended or adjusted under 35 U.S.C. 154(b) by 635 days.

(21) Appl. No.: 18/336,546

(22) Filed: Jun. 16, 2023

(65) Prior Publication Data

US 2024/0348014 A1 Oct. 17, 2024

Related U.S. Application Data

(60) Provisional application No. 63/495,857, filed on Apr. 13, 2023.

(51) Int. Cl.
*H01S 5/183* (2006.01)
*H01S 5/042* (2006.01)
*H01S 5/42* (2006.01)

(52) U.S. Cl.
CPC .......... *H01S 5/18311* (2013.01); *H01S 5/042* (2013.01); *H01S 5/18313* (2013.01); *H01S 5/18322* (2013.01); *H01S 5/1833* (2013.01); *H01S 5/18347* (2013.01); *H01S 5/423* (2013.01)

(58) Field of Classification Search
CPC .. H01S 5/18311; H01S 5/042; H01S 5/18313; H01S 5/18322; H01S 5/1833; H01S 5/18347; H01S 5/423
See application file for complete search history.

(56) References Cited

U.S. PATENT DOCUMENTS

| | | | | |
|---|---|---|---|---|
| 2019/0305522 | A1* | 10/2019 | Yuen | H01S 5/04254 |
| 2020/0321754 | A1* | 10/2020 | Hegblom | H01S 5/4025 |
| 2022/0200240 | A1* | 6/2022 | Barve | H01S 5/18313 |
| 2023/0006422 | A1* | 1/2023 | Barve | H01S 5/423 |

* cited by examiner

*Primary Examiner* — Yuanda Zhang
(74) *Attorney, Agent, or Firm* — Harrity & Harrity, LLP

(57) ABSTRACT

A vertical-cavity surface-emitting laser (VCSEL) device includes a first distributed Bragg reflector (DBR) minor; a second DBR minor arranged on the first DBR mirror; an active layer arranged between the first DBR mirror and the second DBR mirror; and an oxidation layer arranged between the active layer and the second DBR mirror. The oxidation layer comprises an oxide aperture formed through the oxidation layer. A plurality of segmented oxidation trenches are arranged around an area in which the oxide aperture is formed and extend into the stacked structure to expose the oxidation layer for oxidation that forms the oxide aperture. A plurality of plating islands are spatially separated from each other. Each plating island vertically extends into a respective segmented oxidation trench of the plurality of segmented oxidation trenches and seals the respective segmented oxidation trench in order to prevent further oxidation of the oxidation layer.

20 Claims, 3 Drawing Sheets

200

PLATED TRENCH FOR PARASITIC CAPACITANCE CONTROL OF VERTICAL CAVITY SURFACE EMITTING LASER DEVICES

CROSS-REFERENCE TO RELATED APPLICATION

This Patent Application claims priority to U.S. Patent Application No. 63/495,857, filed on Apr. 13, 2023. The disclosure of the prior Application is considered part of and is incorporated by reference into this Patent Application.

TECHNICAL FIELD

The present disclosure relates generally to vertical-cavity surface-emitting laser (VCSEL) devices and VCSEL devices with segmented oxidation trenches with respective plating islands.

BACKGROUND

A VCSEL is a type of semiconductor laser diode (e.g., a laser resonator) with laser beam emission perpendicular from a top surface or a bottom surface of the device. VCSELs typically includes two distributed Bragg reflector (DBR) minors arranged parallel to a wafer surface with an active region arranged between the two DBR mirrors. The active region includes one or more quantum wells for laser light generation. VCSELs are widely used in various applications, such as data communications, sensing, and optical interconnects, due to advantages over other types of lasers. For example, VCSELs typically have lower power consumption (e.g., VCSELs require much lower power to operate than other types of lasers, making them more energy-efficient and cost-effective), are capable of high-speed operation (e.g., making VCSELs ideal for data communications and other applications that require fast signal transmission), have narrow beam divergence (e.g., the narrow beam divergence of VCSELs allows for high coupling efficiency with optical fibers and other components, making VCSELs easier to integrate into optical systems), and have high reliability (e.g., VCSELs have a long operating lifetime and are less prone to failure than other types of lasers).

SUMMARY

In some implementations, a VCSEL device includes a device structure comprising a main surface, wherein the device structure comprises a stacked structure comprising: a first DBR mirror; a second DBR minor arranged on the first DBR mirror; an active layer comprising one or more quantum wells and configured to generate laser light, wherein the active layer is arranged between the first DBR minor and the second DBR minor; and an oxidation layer arranged between the active layer and the second DBR minor, wherein the oxidation layer comprises an oxide aperture formed through the oxidation layer for limiting a current flow of a current to the active layer, which generates light to form a laser beam; a plurality of segmented oxidation trenches that extend from the main surface into the device structure to expose the oxidation layer for oxidation that forms the oxide aperture, wherein the plurality of segmented oxidation trenches are arranged around a periphery of a device area of the device structure in which the oxide aperture is formed; and a plurality of plating islands that are spatially separated from each other, wherein each plating island of the plurality of plating islands vertically extends into a respective segmented oxidation trench of the plurality of segmented oxidation trenches and seals the respective segmented oxidation trench in order to prevent further oxidation of the oxidation layer.

In some implementations, a VCSEL device includes a stacked structure comprising a main surface, wherein the stacked structure comprises: a first DBR minor; a second DBR mirror arranged on the first DBR minor; an active layer comprising one or more quantum wells and configured to generate laser light, wherein the active layer is arranged between the first DBR mirror and the second DBR minor; and an oxide layer arranged between the active layer and the second DBR minor, wherein the oxide layer comprises an oxide aperture formed through the oxide layer for limiting a current flow of a current into the active layer, which generates light to form a laser beam; a plurality of segmented oxidation trenches that extend from the main surface into the stacked structure to expose the oxide layer for oxidation that forms the oxide aperture, wherein the plurality of segmented oxidation trenches are arranged at a periphery of a device area of the stacked structure in which the oxide aperture is formed; and a plurality of plating islands that are spatially separated from each other, wherein each plating island of the plurality of plating islands vertically extends into a respective segmented oxidation trench of the plurality of segmented oxidation trenches and seals the respective segmented oxidation trench in order to prevent further oxidation of the oxidation layer.

In some implementations, a method of forming a VCSEL device includes forming a stacked structure comprising a main surface, wherein the stacked structure comprises: a first DBR mirror; a second DBR minor arranged on the first DBR mirror; an active layer comprising one or more quantum wells and configured to generate laser light, wherein the active layer is arranged between the first DBR minor and the second DBR mirror; and an oxide layer arranged between the active layer and the second DBR minor; forming a plurality of segmented oxidation trenches that extend from the main surface into the stacked structure to expose the oxide layer for oxidation to form an oxide aperture that extends through a thickness dimension of the oxide layer, wherein the oxide aperture is configured to limit a current flow of a current into the active layer, which generates light to form a laser beam, wherein the plurality of segmented oxidation trenches are arranged at a periphery of a device area of the stacked structure in which the oxide aperture is formed; and forming a plurality of plating islands that are spatially separated from each other, wherein each plating island of the plurality of plating islands vertically extends into a respective segmented oxidation trench of the plurality of segmented oxidation trenches and seals the respective segmented oxidation trench in order to prevent further oxidation of the oxidation layer.

DETAILED DESCRIPTION

Figure 1A:
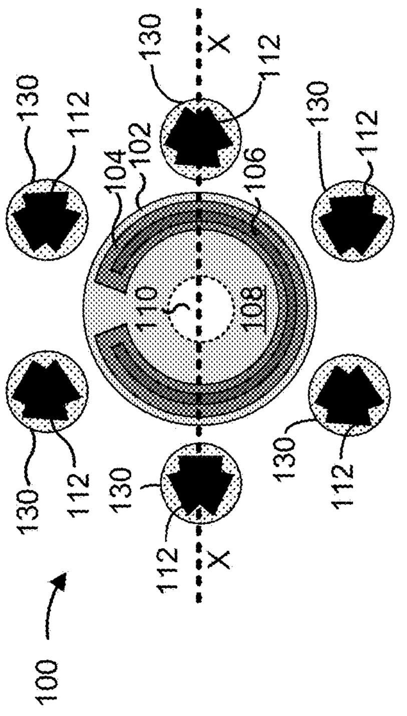
FIGS. 1A and 1B are diagrams depicting a top-view of an example emitter, and a cross-sectional view of the example emitter along the line X-X, respectively.

The following detailed description of example implementations refers to the accompanying drawings. The same reference numbers in different drawings may identify the same or similar elements.

Successful high speed active device designs require careful consideration on transmission line structures for delivering signals from external radio-frequency sources to a functional part of the high-speed active device. A signal delivery efficiency depends largely on device structure and, more importantly, on parasitic elements associated with the device structure. VCSELs, due to their compact size compared to other semiconductor lasers, are used widely in the industry, from consumer electronics to data transmission cables. With a growing demand for data transmission bandwidth, a further improvement on a bandwidth of VCSELs is in strong demand.

Bandwidth of a VCSEL is determined by the VCSEL's intrinsic electro-opto conversion response (e.g., laser response) and a parasitic response coming from a structure of the VCSEL. In other words, an increase of the VCSEL's parasitic capacitance results in a decrease in the bandwidth of the VCSEL. In order to deliver radio-frequency (RF) signals efficiently to a VCSEL, transmission line and pad structures should be designed to minimize signal reflection and absorption before the radio-frequency signals reach an active region of the VCSEL, where an electro-opto conversion occurs for generating the laser light. The signal reflection and absorption may be minimized through a reduction of structure capacitance. In other words, the bandwidth of the VCSEL can be increased by decreasing the VCSEL's parasitic capacitance.

A wet oxidation and implantation process may be used to confine an optical mode and to direct a current into the active region of the VCSEL. One or more oxidation trenches are formed in order to expose an oxidation layer in order to perform the wet oxidation and implantation processes. A deep oxidation trench may be etched into an epitaxial (epi) material to expose a high aluminum (Al) content layer for oxidation. The exposed high aluminum content layer is then oxidized to form an oxidation aperture for current and optical confinement. A thick plating layer (e.g., gold plating layer) and one or more passivation layers may be deposited over and into the oxidation trench as a moisture barrier and heat sink for providing moisture and thermal protection, respectively. The plating deposited over and within the oxidation trench is important for reliability purposes. However, the plating will also result in an additional parasitic capacitance, which will increase an overall input impedance of the VCSEL device and will limit the RF signal delivery to the active region. In other words, the plating increases the structure capacitance, which causes the signal reflection and/or absorption of RF signals to increase and limits a transmission efficiency of the RF signals to the active region. As a result, the plating limits the bandwidth of the VCSEL.

Since capacitance is proportional to frequency, the capacitance dominates the response behavior of the VCSEL. Thus, at high frequencies, the RF signal gets either reflected or dissipated during the transmission, and the resulting response of the VCSEL is reduced. The overall bandwidth and frequency response will be the multiplicative product of the electro-opto (E-O) laser intrinsic response and parasitic response. The parasitic response is determined by the device structure, and the dominant factor at high frequency is capacitance, which is proportional to the frequency.

The capacitances formed from the plating and implanted areas contribute to equivalent lumped capacitance, and plating capacitance and implanted area capacitance are both proportional to a trench area of the oxidation trench. Since capacitance is proportional to a size of the plating area, a minimal plating area would result in a lower capacitance and a higher VCSEL bandwidth. Thus, minimizing the plating area may improve VCSEL bandwidth, which may be useful for high-speed applications, such as high-speed optical communications.

Some implementations are directed to a VCSEL device that includes a device structure having a main surface. The device structure may include a stacked structure that includes a first DBR mirror; a second DBR minor arranged on the first DBR mirror; an active layer arranged between the first DBR minor and the second DBR mirror; and an oxidation layer arranged between the active layer and the second DBR minor. The oxidation layer includes an oxide aperture formed through the oxidation layer for limiting a current flow of a current to the active layer, which generates light to form a laser beam. The oxide aperture may be formed during an oxidation process of the oxide layer. The VCSEL device may further include a plurality of segmented oxidation trenches that may be arranged around a periphery of a device area in which the oxide aperture is formed. Each segmented oxidation trench of the plurality of segmented oxidation trenches may extend from the main surface into the device structure to expose the oxidation layer for oxidation that forms the oxide aperture. The VCSEL device may further include a plurality of plating islands that are spatially separated from each other. Each plating island vertically extends into a respective segmented oxidation trench of the plurality of segmented oxidation trenches and seals the respective segmented oxidation trench in order to prevent further oxidation of the oxidation layer. In other words, each segmented oxidation trench may be at least partially filled with and sealed by one of the plating islands to prevent further oxidation of the oxidation layer.

In some implementations, each plating island of the plurality of plating islands laterally extends from the respective segmented oxidation trench over the main surface to seal the respective segmented oxidation trench. For example, each plating island of the plurality of plating islands may be formed over the main surface around an edge region of the respective segmented trench to seal the respective segmented oxidation trench.

In some implementations, the plurality of segmented oxidation trenches are arranged in a discontinuous arc around the periphery of the device area. As a result, the plurality of plating islands may be similarly arranged in a discontinuous arc around the periphery of the device area.

The plurality of plating islands may be dimensioned to reduce a parasitic capacitance of the VCSEL. As a result, the plurality of plating islands may be dimensioned to increase a bandwidth of the VCSEL. For example, an amount of plating material used to form the plating islands and/or a total plating area (e.g., surface area) of the plurality of plating islands may be reduced such that the parasitic capacitance is also reduced. By reducing the parasitic capacitance, the bandwidth of the VCSEL may be increased.

Figure 1B:
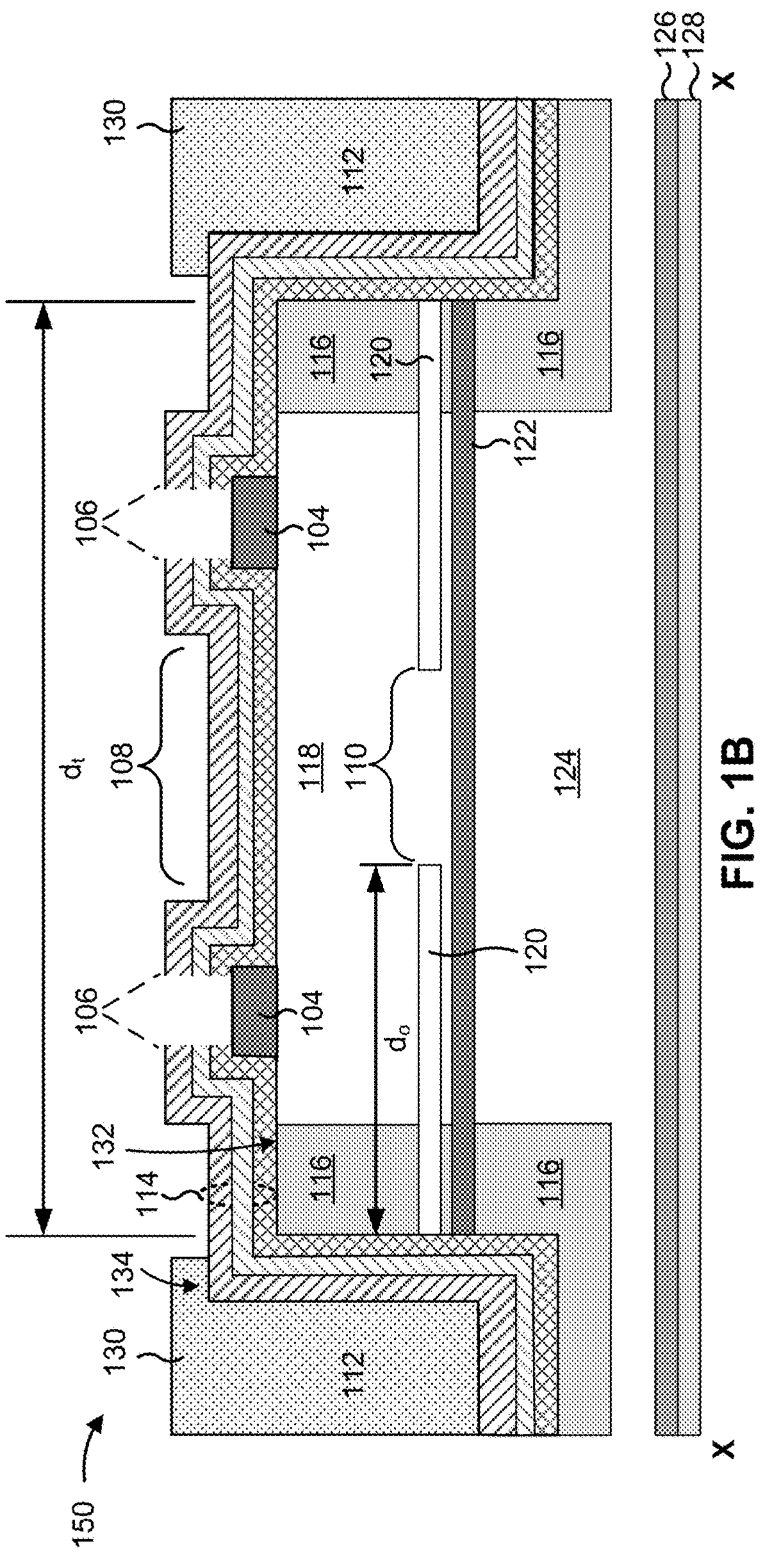

FIGS. 1A and 1B are diagrams depicting a top-view of an example emitter 100 and a cross-sectional view 150 of example emitter 100 along the line X-X, respectively. As shown in FIG. 1A, emitter 100 may include a set of emitter layers constructed in an emitter architecture. In some implementations, emitter 100 may correspond to one or more vertical-emitting devices described herein, such as a VCSEL. In some implementations, the emitter 100 may be referred to as a device structure of a vertical-emitting device. The device structure may include a stacked structure of emitter layers that is configured to generate light in a form of a laser beam.

As shown in FIG. 1A, emitter 100 may include an implant protection layer 102 that is circular in shape in this example. In some implementations, the implant protection layer 102 may have another shape, such as an elliptical shape, a polygonal shape, or the like. The implant protection layer 102 is defined based on a space between sections of implant material (not shown) included in the emitter 100. The implant protection layer 102 may define a periphery of a device area of the emitter architecture.

As shown by the medium gray and dark gray areas in FIG. 1A, emitter 100 includes an ohmic metal layer 104 (e.g., a P-Ohmic metal layer or an N-Ohmic metal layer) that is constructed in a partial ring-shape (e.g., with an inner radius and an outer radius). The medium gray area shows an area of ohmic metal layer 104 covered by a protective layer (e.g. a dielectric layer or a passivation layer) of the emitter 100 and the dark gray area shows an area of ohmic metal layer 104 exposed by via 106, described below. As shown, the ohmic metal layer 104 overlaps with the implant protection layer 102. Such a configuration may be used, for example, in the case of a P-up/top-emitting emitter 100. In the case of a bottom-emitting emitter 100, the configuration may be adjusted as needed.

Not shown in FIG. 1A, the emitter 100 includes a protective layer in which via 106 is formed (e.g., etched). The dark gray area shows an area of the ohmic metal layer 104 that is exposed by the via 106 (e.g., the shape of the dark gray area may be a result of the shape of the via 106) while the medium grey area shows an area of the ohmic metal layer 104 that is covered by some protective layer. The protective layer may cover all of the emitter other than the vias. As shown, the via 106 is formed in a partial ring-shape (e.g., similar to the ohmic metal layer 104) and is formed over the ohmic metal layer 104 such that metallization on the protection layer contacts the ohmic metal layer 104. In some implementations, the via 106 and/or the ohmic metal layer 104 may be formed in another shape, such as a full ring-shape or a split ring-shape.

As further shown, the emitter 100 includes an optical aperture 108 in a portion of the emitter 100 within the inner radius of the partial ring-shape of the ohmic metal layer 104. The emitter 100 emits a laser beam via the optical aperture 108. As further shown, the emitter 100 also includes a current confinement aperture 110 (e.g., an oxide aperture formed by an oxidation layer of the emitter 100 (not shown)). The current confinement aperture 110 is formed below the optical aperture 108.

As further shown in FIG. 1A, the emitter 100 includes a set of trenches 112 (e.g., oxidation trenches) that are spaced (e.g., equally, unequally) around a circumference of the implant protection layer 102 (e.g., arranged around a periphery of the device area of the emitter architecture in which the current confinement aperture 110 is formed). In other words, the set of trenches 112 are a plurality of segmented oxidation trenches that are discontinuously formed around the device area of the emitter 100. The set of trenches 112 are used to expose the oxidation layer during an oxidation process performed for forming the current confinement aperture 110. For example, each trench 112 may be configured to enable an oxidation of a corresponding portion of the oxidation layer. How closely the trenches 112 can be positioned relative to the optical aperture 108 is dependent on the application, and is typically limited by the implant protection layer 102, the ohmic metal layer 104, the via 106, and manufacturing tolerances. How closely trenches 112 are positioned relative to the optical aperture 108 may also be used to define a size of the current confinement aperture 110.

The number and arrangement of layers shown in FIG. 1A are provided as an example. In practice, emitter 100 may include additional layers, fewer layers, different layers, or differently arranged layers than those shown in FIG. 1A. For example, while the emitter 100 includes a set of six trenches 112, in practice, other configurations are possible, such as a compact emitter that includes five trenches 112, seven trenches 112, or another quantity of trenches. In some implementations, trenches 112 may encircle emitter 100 to form a mesa-like structure $d_r$ or to define the device area of the emitter 100 in which light is generated. As another example, while emitter 100 is a circular emitter design, in practice, other designs may be used, such as a rectangular emitter, a hexagonal emitter, an elliptical emitter, or the like. Additionally, or alternatively, a set of layers (e.g., one or more layers) of emitter 100 may perform one or more functions described as being performed by another set of layers of emitter 100, respectively.

Notably, while the design of emitter 100 is described as including a VCSEL, other implementations are possible. For example, the design of emitter 100 may apply in the context of another type of optical device, such as a light emitting diode (LED), or another type of vertical emitting (e.g., top emitting or bottom emitting) optical device. Additionally, the design of emitter 100 may apply to emitters of any wavelength, power level, and/or emission profile. In other words, emitter 100 is not particular to an emitter with a given performance characteristic.

As shown in FIG. 1B, the example cross-sectional view may represent a cross-section of emitter 100 that passes through, or between, a pair of trenches 112 (e.g., as shown by the line labeled "X-X" in FIG. 1A). As shown, emitter 100 may include a backside cathode layer 128, a substrate layer 126, a bottom mirror 124, an active region 122 (e.g., an active layer), an oxidation layer 120, a top mirror 118, an implant isolation material 116, a protective layer 114 (e.g. a dielectric passivation/mirror layer), and an ohmic metal layer 104. As shown, the emitter 100 may have, for example, a total height that is approximately 10 Rm. The trenches 112 may extend into a stacked structure of the emitter 100 that is formed by the bottom mirror 124, the active region 122, the oxidation layer 120, and the top mirror 118. While not explicitly shown in FIG. 1B, each trench 112 may be enclosed by one or more sidewalls.

The backside cathode layer 128 may include a layer that makes electrical contact with the substrate layer 126. For example, the backside cathode layer 128 may include an annealed metallization layer, such as an AuGeNi layer, a PdGeAu layer, or the like.

The substrate layer 126 may include a base substrate layer upon which epitaxial layers are grown. For example, the substrate layer 126 may include a semiconductor layer, such as a GaAs layer, an InP layer, and/or another type of semiconductor layer.

The bottom mirror 124 may include a bottom reflector layer of the emitter 100. For example, bottom minor 124 may include a distributed Bragg reflector (DBR).

The active region 122 may include a layer that confines electrons and defines an emission wavelength of the emitter 100. For example, the active region 122 may be a quantum well or may include one or more quantum wells. The active region 122 may be arranged between the bottom minor 124 and the top minor 118.

The oxidation layer 120 may be arranged between the active region 122 and the top mirror 118. The oxidation layer 120 may include an oxide layer that provides optical and electrical confinement of the emitter 100. In some implementations, the oxidation layer 120 may be formed as a result of wet oxidation of an epitaxial layer. For example, the oxidation layer 120 may be an Al2O3 layer formed as a result of oxidation of an AlAs or AlGaAs layer. The trenches 112 may include openings that allow oxygen (e.g., dry oxygen, wet oxygen) to access the epitaxial layer from which the oxidation layer 120 is formed. The oxidation of the epitaxial layer may be used to form the current confinement aperture 110. For example, the trenches may be etched into the epitaxial material of the epitaxial layer to expose a high aluminum (Al) content layer for oxidation. The exposed high aluminum content layer is then oxidized to form the current confinement aperture 110 for current and optical confinement.

During oxidation, the oxidation of the epitaxial layer may progress from the trenches 112 inward. Further oxidation of the oxidation layer 120 may be stopped or prevented by sealing the trenches 112 with a plating material when the current confinement aperture 110 is formed with a desired shape and size (e.g., diameter). Thus, as the epitaxial layer is oxidized, the oxidized portions of the epitaxial layer form the oxidation layer 120. The remaining, unoxidized portion of the epitaxial layer forms the current confinement aperture 110. Thus, the current confinement aperture 110 is formed through or extends through a thickness dimension of the oxidation layer 120.

The current confinement aperture 110 may include an optically active aperture defined by the oxidation layer 120. A size of the current confinement aperture 110 may range, for example, from approximately 4 μm to approximately 20 μm. In some implementations, a size of the current confinement aperture 110 may depend on a distance between the trenches 112 that surround the emitter 100. For example, the trenches 112 may be etched to expose the epitaxial layer from which the oxidation layer 120 is formed. Here, before the protective layer 114 is formed (e.g., deposited), oxidation of the epitaxial layer may occur for a particular distance (e.g., identified as distance $d_o$ in FIG. 1B) toward a center of the emitter 100, thereby forming oxidation layer 120 and the current confinement aperture 110. In some implementations, the current confinement aperture 110 may include an oxide aperture. Additionally, or alternatively, the current confinement aperture 110 may include an aperture associated with another type of current confinement technique, such as an etched mesa, a region without ion implantation, lithographically defined intra-cavity mesa and regrowth, or the like.

The current confinement aperture 110 may be formed through the oxidation layer 120 for limiting a current flow of a current to the active region 122 (e.g., to the active layer), which generates light to form a laser beam. For example, the current may be injected from ohmic metal layer 104, used as a top contact, through the top mirror 118 and then throttled through the current confinement aperture 110 to the active region 122 to excite an active material of the active region 122 to generate the light that is used to form the laser beam. In response to receiving the current injection that passes through the current confinement aperture 110, the active region 122 generates light, and the light is laterally confined inside an aperture region but is also able to travel through the current confinement aperture 110 and emitted from the top of the emitter 100 (e.g., through the optical aperture 108). Thus, the light is laterally confined within the device area of the emitter 100 and is configured to pass through the current confinement aperture 110 and exit a main surface of the emitter 100 as the laser beam.

The top mirror 118 may include a top reflector layer of the emitter 100. For example, the top mirror 118 may include a DBR.

The implant isolation material 116 may include a material that provides electrical isolation. For example, the implant isolation material 116 may include an ion implanted material, such as a hydrogen/proton implanted material or a similar implanted element to reduce conductivity. In some implementations, the implant isolation material 116 may define the implant protection layer 102.

The protective layer 114 may include a layer that acts as a protective passivation layer and which may act as an additional DBR. For example, the protective layer 114 may include one or more sub-layers (e.g., a dielectric passivation layer and/or a mirror layer, a SiO2 layer, a Si3N4 layer, an Al2O3 layer, or other layers) deposited (e.g., by chemical vapor deposition, atomic layer deposition, or other techniques) on one or more other layers of emitter 100.

As shown, the protective layer 114 may include one or more vias 106 that provide electrical access to the ohmic metal layer 104. For example, the via 106 may be formed as an etched portion of the protective layer 114 or a lifted-off section of protective layer 114. The optical aperture 108 may include a portion of the protective layer 114 over the current confinement aperture 110 through which light may be emitted.

The ohmic metal layer 104 may include a layer that makes electrical contact through which electrical current may flow. For example, the ohmic metal layer 104 may include a Ti and Au layer, a Ti and Pt layer and/or an Au layer, or the like, through which electrical current may flow (e.g., through a bondpad (not shown) that contacts ohmic metal layer 104 through via 106). The ohmic metal layer 104 may be P-ohmic, N-ohmic, or other forms known in the art. Selection of a particular type of the ohmic metal layer 104 may depend on the architecture of the emitters and is well within the knowledge of a person skilled in the art. The ohmic metal layer 104 may provide ohmic contact between a metal and a semiconductor and/or may provide a non-rectifying electrical junction and/or may provide a low-resistance contact. In some implementations, the emitter 100 may be manufactured using a series of steps. For example, the bottom mirror 124, the active region 122, the oxidation layer 120, and the top mirror 118 may be epitaxially grown on the substrate layer 126, after which the ohmic metal layer 104 may be deposited on the top minor 118. Next, the trenches 112 may be etched to expose the oxidation layer 120 for oxidation. The implant isolation material 116 may be created via ion implantation, after which the protective layer 114 may be deposited. In some implementations, the protective layer 114 may be deposited in the trenches 112 to line the bottoms and sidewalls of the trenches 112. The via 106 may be etched in the protective layer 114 (e.g., to expose the ohmic metal layer 104 for contact). Plating, seeding, and etching may be performed, the substrate layer 126 may be thinned and/or lapped to a target thickness. Finally, the backside cathode layer 128 may be deposited on a bottom side of the substrate layer 126.

During plating, each trench 112, or a remaining (e.g., unfilled) portion of each trench 112, may be filled with plating material in order to seal a respective trench 112 and protect the device from moisture and/or oxygen. In other words, the plating material may prevent moisture and oxygen from entering a respective trench 112 and/or coming in contact with other emitter layers of the emitter 100. For example, moisture may cause corrosion and/or electrical failure. Oxygen may cause further oxidation of the epitaxial layer, which may result in undesired changes in the size and/or shape of the current confinement aperture 110. In addition, the plating material may be used as a heat sink to draw heat away from the device area (e.g., the light generating area) of the emitter 100. Thus, the plating material may provide thermal protection.

Accordingly, a plurality of plating islands 130 that are spatially separated from each other and formed from the plating material may be provided. Each plating island 130 may vertically extend into a respective trench 112 (e.g., a respective segmented oxidation trench) and seal the respective trench 112 in order to prevent further oxidation of the oxidation layer 120, as well as sealing the respective trench 112 from other contaminants, such as moisture. The plating material may be made of a metal, such as gold.

The plurality of plating islands 130 may be spaced (e.g., equally, unequally) around the circumference of implant protection layer 102 (e.g., arranged around the periphery of the device area of the emitter architecture in which the current confinement aperture 110 is formed). In other words, the plurality of plating islands 130 may form discrete structures that are discontinuously formed around the device area of the emitter 100 based on an arrangement of the trenches 112. Therefore, the trenches 112 and the plating islands 130 may be arranged circumferentially around the periphery of the device area of the emitter 100. Additionally, or alternatively, the trenches 112 and the plating islands 130 may be arranged in a discontinuous arc around the periphery of the device area of the emitter 100.

In some implementations, each plating island 130 may laterally extend from the respective trench 112 to laterally extend over the protective layer 114 and/or a main surface 132 of the emitter architecture (e.g., a main surface of the stacked structure of the emitter layers) to seal the respective segmented oxidation trench. The main surface 132 may correspond to an upper surface of the top mirror 118. Accordingly, each plating island 130 may be formed over the protective layer 114 and/or a main surface 132 around an edge region 134 of the respective trench 112 to seal the respective trench 112.

The plurality of plating islands 130 may be dimensioned to reduce a parasitic capacitance of the emitter 100. As a result, the plurality of plating islands 130 may be dimensioned to increase a bandwidth of the emitter 100. For example, an amount of plating material used to form the plating islands 130 and/or a total plating area (e.g., total surface area of the plating islands) of the plurality of plating islands 130 may be reduced such that the parasitic capacitance of the emitter 100 is also reduced. By reducing the parasitic capacitance, the bandwidth of the emitter 100 may be increased.

For example, since capacitance is proportional to frequency, the capacitance dominates the response behavior of the emitter 100. Thus, at high frequencies, an RF signal gets either reflected or dissipated during the transmission, and the resulting response of the emitter 100 is reduced due to the capacitance. An overall bandwidth and frequency response of the emitter 100 will be a multiplicative product of an E-O laser intrinsic response and a parasitic response. The parasitic response is determined by the device structure, and the dominant factor at high frequency is capacitance, which is proportional to the frequency.

The capacitances formed from the plating material and implanted areas (e.g., implant isolation material 116) contribute to equivalent lumped capacitance, and plating capacitance and the implanted area capacitances are both proportional to a trench area of the trenches 112. Since capacitance is proportional to an area of the plating area, a minimal plating area may result in a lower capacitance and a higher bandwidth. Thus, minimizing the plating area may improve bandwidth, which may be useful for high-speed applications, such as high-speed optical communications. The separation of the plurality of plating islands 130 helps to minimize the plating area. The parasitic capacitance from the plating capacitance can be tuned by dimensioning the plating area of the plurality of plating islands 130. Thus, the bandwidth of the emitter 100 may be controlled and tuned by dimensioning the plating area of the plurality of plating islands 130. The parasitic response of the emitter 100 may be enhanced through the reduction of the parasitic capacitance, and the overall response of the emitter 100 may be increased accordingly. A resulting benefit of a reduction in the parasitic capacitance is an increase of a high-speed bandwidth of the emitter 100 through an improved parasitic response at high frequencies.

The segmented trenches and respective segmented platings to reduce parasitic capacitance may be applied to various VCSEL architectures, including, but not limited to, oxide-confined VCSEL, implant-only VCSEL, mesa-type devices, etc. In addition, segmented trenches and respective segmented platings to reduce parasitic capacitance may be applicable across a range of wavelengths (e.g., 900 nm to 1550 nm) and across different material systems (e.g., GaAs substrates, InP substrates, etc.). In some implementations, the emitter 100 may be a bottom-emitting VCSEL. In some implementations, the emitter 100 may be a top-emitting VCSEL. A quantity, size, and shape of the emitter 100 can be varied in accordance with the application. Additionally, while an emitter structure with a circular oxidation aperture shape is illustrated for the emitter 100, other aperture shapes may be used (e.g., an oval aperture shape). Thus, the segmented trenches and respective segmented platings may be used for any aperture shape to reduce the parasitic capacitance through a device and process layout change. The segmented trenches and respective segmented platings formed around the active region 122 with minimized trench and plating areas provide reduced capacitance and increased bandwidth.

The number, arrangement, thicknesses, order, symmetry, or the like, of layers shown in FIG. 1B is provided as an example. In practice, emitter 100 may include additional layers, fewer layers, different layers, differently constructed layers, or differently arranged layers than those shown in FIG. 1B. Additionally, or alternatively, a set of layers (e.g., one or more layers) of emitter 100 may perform one or more functions described as being performed by another set of layers of emitter 100 and any layer may comprise more than one layer.

Figure 2:
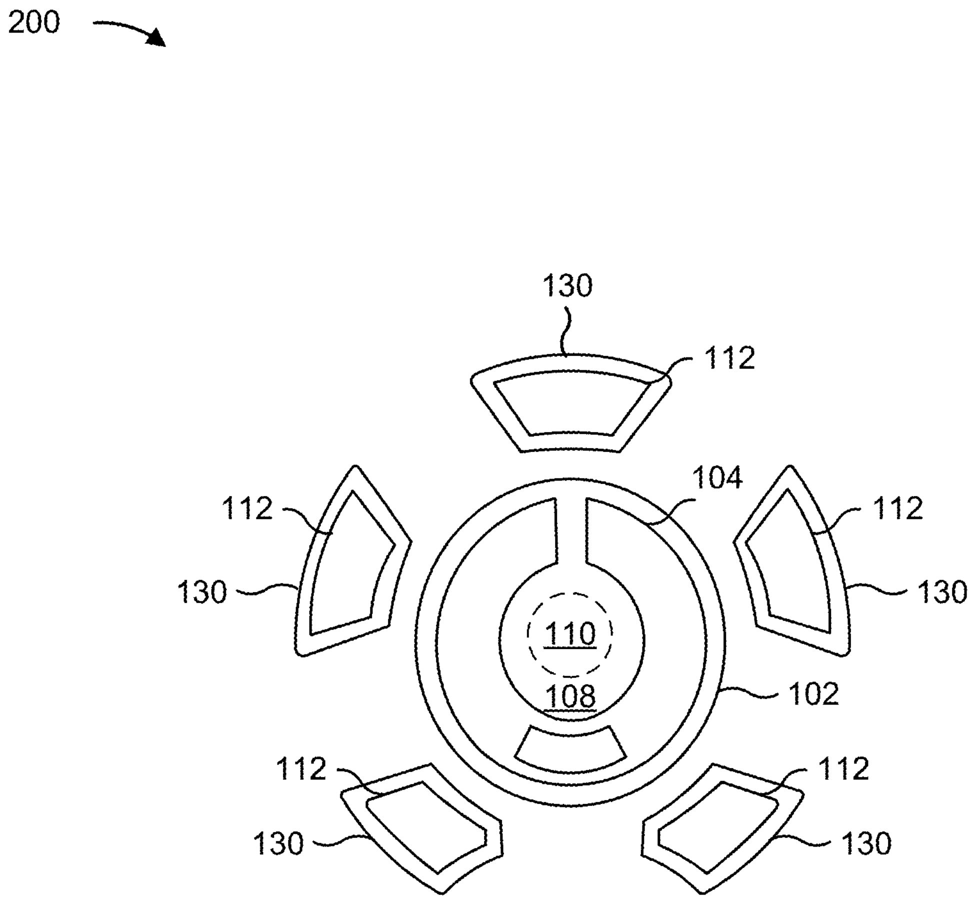
FIG. 2 is a diagram depicting a top-view of an example emitter.

FIG. 2 is a diagram depicting a top-view of an example emitter 200. The emitter 200 may be similar to the emitter 100 described in connection with FIGS. 1A and 1B, with the exception that the trenches 112 and plating islands 130 have a different pattern. For example, the number of the trenches 112 and plating islands 130, a shape of the trenches 112 and plating islands 130, and an arrangement of the trenches 112 and plating islands 130 may differ from the number, shape, and arrangement of the trenches 112 and plating islands 130 shown in FIG. 1A. For example, using fewer trenches 112 and plating islands 130 may reduce the total plating area of the emitter, which may reduce the parasitic capacitance and increase the bandwidth.

As indicated above, FIG. 2 is provided as an example. Other examples may differ from what is described with regard to FIG. 2.

Figure 3:
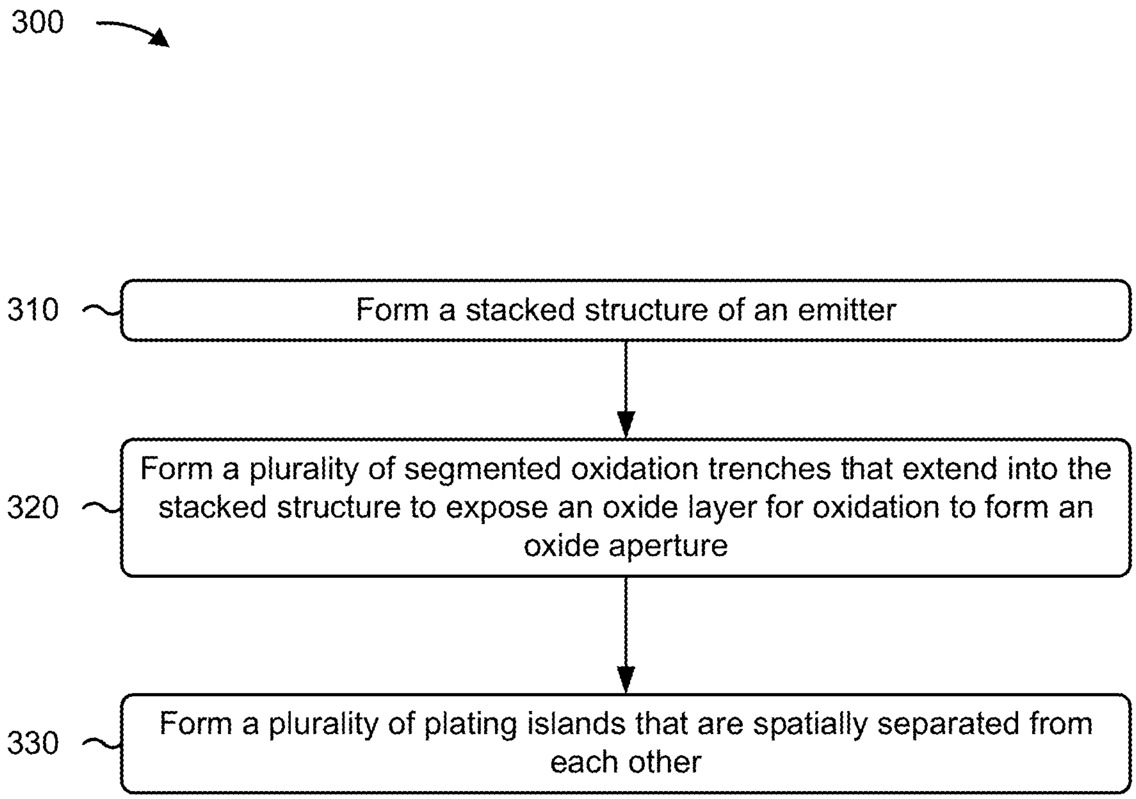
FIG. 3 is a flowchart of an example process associated with forming an emitter with plated trenches for parasitic capacitance control.

FIG. 3 is a flowchart of an example process 300 associated with forming an emitter with plated trenches for parasitic capacitance control. In some implementations, one or more process blocks of FIG. 3 are performed to manufacture the emitter 100. In some implementations, one or more process blocks of FIG. 3 are performed by device or a group of devices. Additionally, or alternatively, one or more process blocks of FIG. 3 may be performed by one or more components for manufacturing the emitter 100.

As shown in FIG. 3, process 300 may include forming a stacked structure (block 310). The stacked structure may include a main surface, a first DBR mirror (e.g., bottom mirror); a second DBR minor (e.g., top minor) arranged on the first DBR mirror; an active layer arranged between the first DBR minor and the second DBR mirror, comprising one or more quantum wells, and configured to generate laser light; and an oxide layer arranged between the active layer and the second DBR mirror, as described above.

As further shown in FIG. 3, process 300 may include forming a plurality of segmented oxidation trenches that extend from the main surface into the stacked structure to expose the oxide layer for oxidation to form an oxide aperture that extends through a thickness dimension of the oxide layer (block 320). The oxide aperture may be a current confinement aperture that is configured to limit a current flow of a current into the active layer, which generates light to form a laser beam. The plurality of segmented oxidation trenches may be arranged at a periphery of a device area of the stacked structure in which the oxide aperture is formed. For example, the plurality of segmented oxidation trenches may be formed as described above.

As further shown in FIG. 3, process 300 may include forming a plurality of plating islands that are spatially separated from each other (block 330). Each plating island may extend into a respective segmented oxidation trench of the plurality of segmented oxidation trenches and seal the respective segmented oxidation trench in order to prevent further oxidation of the oxidation layer. For example, the plurality of plating islands may be formed as described above.

Process 300 may include additional implementations, such as any single implementation or any combination of implementations described above and/or in connection with one or more other processes described elsewhere herein.

Although FIG. 3 shows example blocks of process 300, in some implementations, process 300 includes additional blocks, fewer blocks, different blocks, or differently arranged blocks than those depicted in FIG. 3. Additionally, or alternatively, two or more of the blocks of process 300 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A vertical-cavity surface-emitting laser (VCSEL) device, comprising:

a device structure comprising a main surface, wherein the device structure comprises a stacked structure comprising:

a first distributed Bragg reflector (DBR) mirror;

a second DBR mirror arranged on the first DBR mirror;

an active layer comprising one or more quantum wells and configured to generate laser light, wherein the active layer is arranged between the first DBR mirror and the second DBR mirror; and an oxidation layer arranged between the active layer and the second DBR mirror, wherein the oxidation layer comprises an oxide aperture formed through the oxidation layer for limiting a current flow of a current to the active layer, which generates light to form a laser beam;

a plurality of segmented oxidation trenches that extend from the main surface into the device structure to expose the oxidation layer for oxidation that forms the oxide aperture, wherein the plurality of segmented oxidation trenches are arranged around a periphery of a device area of the device structure in which the oxide aperture is formed; and a plurality of plating islands that are spatially separated from each other, wherein each plating island of the plurality of plating islands vertically extends into a respective segmented oxidation trench of the plurality of segmented oxidation trenches and seals the respective segmented oxidation trench in order to prevent further oxidation of the oxidation layer, the plurality of plating islands are arranged in a discontinuous arc around the periphery of the device area.

2. The VCSEL of claim 1, wherein each plating island of the plurality of plating islands laterally extends from the respective segmented oxidation trench over the main surface to seal the respective segmented oxidation trench.

3. The VCSEL of claim 1, wherein each plating island of the plurality of plating islands is formed over the main surface around an edge region of the respective segmented oxidation trench to seal the respective segmented oxidation trench.

4. The VCSEL of claim 1, wherein the plurality of segmented oxidation trenches are arranged in a discontinuous arc around the periphery of the device area.

5. The VCSEL of claim 1, wherein the plurality of plating islands are dimensioned to reduce a parasitic capacitance of the VCSEL.

6. The VCSEL of claim 1, wherein the plurality of plating islands are dimensioned to increase a bandwidth of the VCSEL.

7. The VCSEL of claim 1, wherein the current is configured to be injected through the second DBR and through the oxide aperture to the active layer to excite an active material of the active layer to generate the light.

8. The VCSEL of claim 7, wherein the light is configured to pass through the oxide aperture and exit the main surface as the laser beam.

9. The VCSEL of claim 1, wherein the plurality of plating islands comprises plating material that provides thermal protection.

10. A vertical-cavity surface-emitting laser (VCSEL) device, comprising:

a stacked structure comprising a main surface, wherein the stacked structure comprises:

a first distributed Bragg reflector (DBR) mirror;

a second DBR mirror arranged on the first DBR mirror;

an active layer comprising one or more quantum wells and configured to generate laser light, wherein the active layer is arranged between the first DBR mirror and the second DBR mirror; and an oxide layer arranged between the active layer and the second DBR mirror, wherein the oxide layer comprises an oxide aperture formed through the oxide layer for limiting a current flow of a current into the active layer, which generates light to form a laser beam;

a plurality of segmented oxidation trenches that extend from the main surface into the stacked structure to expose the oxide layer for oxidation that forms the oxide aperture, wherein the plurality of segmented oxidation trenches are arranged at a periphery of a device area of the stacked structure in which the oxide aperture is formed; and a plurality of plating islands that are spatially separated from each other, wherein each plating island of the plurality of plating islands vertically extends into a respective segmented oxidation trench of the plurality of segmented oxidation trenches and seals the respective segmented oxidation trench in order to prevent further oxidation of the oxidation layer, wherein the plurality of plating islands are arranged in a discontinuous arc around the periphery of the device area.

11. The VCSEL of claim 10, wherein each plating island of the plurality of plating islands laterally extends from the respective segmented oxidation trench over the main surface to seal the respective segmented oxidation trench.

12. The VCSEL of claim 10, wherein each plating island of the plurality of plating islands is formed over the main surface around an edge region of the respective segmented oxidation trench to seal the respective segmented oxidation trench.

13. The VCSEL of claim 10, wherein the plurality of segmented oxidation trenches are arranged in a discontinuous arc around the periphery of the device area.

14. The VCSEL of claim 10, wherein the plurality of plating islands are dimensioned to reduce a parasitic capacitance of the VCSEL.

15. The VCSEL of claim 10, wherein the plurality of plating islands are dimensioned to increase a bandwidth of the VCSEL.

16. The VCSEL of claim 10, wherein the plurality of segmented oxidation trenches and the plurality of plating islands are arranged circumferentially around the periphery of the device area.

17. The VCSEL of claim 16, wherein the light is laterally confined within the device area.

18. The VCSEL of claim 10, wherein the plurality of plating islands comprises plating material that provides thermal protection.

19. A method of forming a vertical-cavity surface-emitting laser (VCSEL) device, comprising:

forming a stacked structure comprising a main surface, wherein the stacked structure comprises:

a first distributed Bragg reflector (DBR) mirror;

a second DBR mirror arranged on the first DBR mirror;

an active layer comprising one or more quantum wells and configured to generate laser light, wherein the active layer is arranged between the first DBR mirror and the second DBR mirror; and an oxide layer arranged between the active layer and the second DBR mirror;

forming a plurality of segmented oxidation trenches that extend from the main surface into the stacked structure to expose the oxide layer for oxidation to form an oxide aperture that extends through a thickness dimension of the oxide layer, wherein the oxide aperture is configured to limit a current flow of a current into the active layer, which generates light to form a laser beam, wherein the plurality of segmented oxidation trenches are arranged at a periphery of a device area of the stacked structure in which the oxide aperture is formed; and forming a plurality of plating islands that are spatially separated from each other, wherein each plating island of the plurality of plating islands vertically extends into a respective segmented oxidation trench of the plurality of segmented oxidation trenches and seals the respective segmented oxidation trench in order to prevent further oxidation of the oxidation layer, wherein the plurality of plating islands are arranged in a discontinuous arc around the periphery of the device area.

20. The method of claim 19, wherein each plating island of the plurality of plating islands is formed over the main surface around an edge region of the respective segmented oxidation trench to seal the respective segmented oxidation trench.

* * * * *